United States Patent [19]

Cohen

[11] Patent Number: 4,818,949

[45] Date of Patent: Apr. 4, 1989

[54] MICROWAVE AND MILLIMETER-WAVE SPECTRUM ANALYZER

[75] Inventor: Jonathan D. Cohen, Hanover, Md.

[73] Assignee: U.S. Government as represented by Director, National Security Agency, Fort George G. Meade, Md.

[21] Appl. No.: 142,114

[22] Filed: Jan. 6, 1988

[51] Int. Cl.$^4$ ............................................. G01R 23/16
[52] U.S. Cl. ..................................... 324/77 B; 324/84
[58] Field of Search ...................... 324/77 B, 77 H, 84, 324/85, 95, 58 B; 342/170; 364/485, 576; 333/166

[56] References Cited

U.S. PATENT DOCUMENTS

| | | | |
|---|---|---|---|
| 3,270,188 | 10/1966 | Ares | 324/77 H |
| 3,768,007 | 10/1973 | Tozer | 324/84 |
| 3,939,411 | 2/1976 | James | 324/77 H |
| 3,956,706 | 5/1976 | Saul | 328/140 |
| 4,414,505 | 11/1983 | Cuckson et al. | 324/85 |
| 4,504,785 | 3/1985 | Tucker et al. | 324/77 H |
| 4,542,657 | 9/1985 | Barber et al. | 73/861.25 |

OTHER PUBLICATIONS

"Correlation Entering New Fields W/Real—Time Signal Analysis", by Bernard Lu Bow, Electronics; Oct. 31, 1966.

Vanasse, G. A. and Sakai, H. "Fourier Spectroscopy", Progress in Optics, vol. VI, 1967, pp. 261-330.

Primary Examiner—Tom Noland
Assistant Examiner—Louis M. Arana
Attorney, Agent, or Firm—John R. Utermohole; Thomas O. Maser

[57] ABSTRACT

An apparatus is described which performs real time spectrum analysis of large bandwidth radio frequency signals. The apparatus allows the simultaneous monitoring of all frequencies within the band of interest, and operates in the presence of multiple frequencies.

10 Claims, 3 Drawing Sheets

MICROWAVE AND MILLIMETER-WAVE SPECTRUM ANALYZER

BACKGROUND OF THE INVENTION

1. Field of Invention

My invention relates to the field of radio frequency analysis, and more specifically to the area of microwave and millimeter-wave spectrum analysis.

2. Brief Description of the Prior Art

The prior art shows a wide variety of methods for assessing the spectral content of radio frequency signals. The earliest methods employed tunable resonant devices. The output of these devices was monitored as the resonance frequency was adjusted. A peak or null in the output identified the input frequency. Such as scheme could only operate when a single input frequency was present and required manual (and slow) scanning of the band of interest.

The most common method of spectrum analysis employs a superheterodyne receiver which is swept over the frequency band of interest. This method accommodates a multitude of frequencies in the signal, allowing each to be recognized independently. Unfortunately, the frequencies are studied sequentially, so that pulsed signals are easily missed, as such signals may be off when the receiver visits their frequencies.

Other approaches, often identified as IFM (instantaneous frequency measurement) devices, measure relative phase between the signal and a delayed version of the signal. Such systems cover all frequencies simultaneously, but can only tolerate one frequency in the signal at any given time. Various improvements made to this basic approach have allowed only modest input diversity.

An exhaustive approach which overcomes the objections cited above is to construct a bank of parallel filters, said filters being driven by the signal simultaneously. The radio frequency power in each filter output is monitored to obtain the desired spectrum. Such a scheme is impractical due to the complexity, bulk, and cost of a large number of filters.

Snapshot transform methods are also used. Here, a record of the recent signal history is first obtained. The samples are then transformed via the Fourier transform. While the transform may be done at low frequencies, the sampling for such a system must be done at the signal frequencies. As such, input frequencies must be below the microwave band.

Acoustooptic or acoustic methods, which exploit wave propagation to implement a Fourier transform, also allow multiple frequencies and cover the entire band at once; however, they too are constrained in bandwidth by their input transducers. Practical devices are limited to a few gigahertz.

Still another microwave and millimeter-wave method, used by the Fourier spectrometer, mechanically scans out the autocorrelation function of the input signal. Said autocorrelation function is Fourier transformed to produce the power spectrum. The Fourier spectrometer consists of a radio frequency Michelson interferometer in which one reflector is moveable, and a detector which is placed at the output of said interferometer. For any position of the moveable reflector, the detector responds to the signal plus a delayed replica of the signal. The detector's slow square-law response causes the detector output to be a measure of the signal's autocorrelation at the delay between the two signals. By moving the reflector, the delay is varied and the autocorrelation is thereby scanned out. The Fourier spectrometer usually uses freespace propagation, rather than guided propagation. The Fourier spectrometer approach suffers from two major drawbacks: First, it is mechanically scanned, making it slow and prone to mechanical failure. Second, the scanning introduces an ambiguity which causes signal modulation to manifest itself as spurious frequencies in the output.

SUMMARY OF THE INVENTION

It is an object of this invention to provide a spectrum analyzer which overcomes the limitations in the prior art.

It is a further object of this invention to provide spectrum analysis of multifrequency signals.

It is a still further object to provide a spectrum analysis of all frequencies at all times in the band of interest.

It is also an object of this invention to provide a spectrum analyzer which is capable of updating its entire output within milliseconds.

Another object of this invention to provide a spectrum analyzer which accommodates input bandwidths in excess of a few gigahertz.

My invention, like the slotted line and Fourier spectrometer, calculates the signal power spectrum from the signal's autocorrelation function, and inherits the advantages of parallel computation of all spectral components, accommodation of multifrequency inputs, and ability to operate on large bandwidths. My contribution is an apparatus which employs computation of the autocorrelation values in parallel, thereby allowing rapid computation and avoiding the gross ambiguities introduced by scanning.

An apparatus having these and other desirable features would include a guiding means for the propagation of an electromagnetic signal, a means for superimposing, in said environment, two replicas of the signal to be analyzed propagating in opposite directions, a means for simultaneously measuring the resulting radio frequency power at spatial intervals along the path of propagation, a means for integrating said power measurements, and a means for effecting the Fourier transform of said integrated measurements.

BRIEF DESCRIPTION OF THE DRAWINGS

My invention may be best understood by reading the specification with reference to the accompanying drawings, in which.

DESCRIPTION OF THE PREFERRED EMBODIMENT

Figure 1:
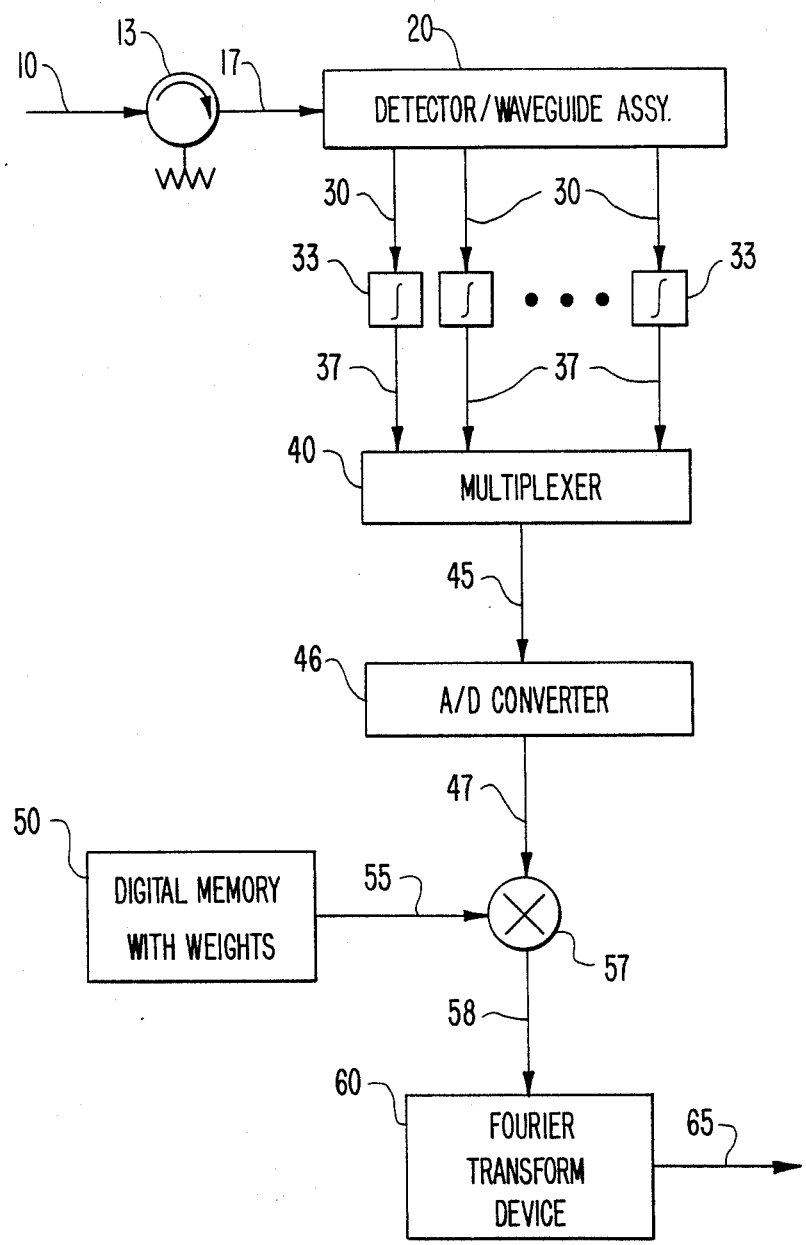
FIG. 1 is a block diagram of a preferred embodiment of my invention.

FIG. 1 illustrates a preferred embodiment of my invention. A signal on input line 10 passes through isolator 13 before entering detector/waveguide assembly 20. The isolator prevents reflected radio frequency power produced by said assembly from passing back to the source. There are n outputs 30—30 from the detector/waveguide assembly which enter integrators 33—33.

The outputs 37—37 of said integrators form the input of a multiplexer 40, which produces the serial stream on line 45 of analog samples of the signals on lines 37—37. This stream is produced by sequentially selecting each input 37 in turn and sending its value to the output. These samples are converted to digital samples on line 47 by the analog-to-digital converter 46. As verified hereinbelow, the stream of samples on line 47 represents the autocorrelation of the input radio frequency signal.

In synchrony with the arrival of autocorrelation samples on line 47, weights, read from digital memory 50, arrive on line 55. The weights are combined with the autocorrelation samples by multiplier 57 to produce a serial stream of products on line 58.

The Fourier transform device 60 collects n products, one from each detector output 30 (and its corresponding weight), and performs a discrete Fourier transform on them. The resulting output stream on line 65 represents the power spectrum of the signal in terms of spatial frequency in the waveguide assembly 20.

Figure 2:
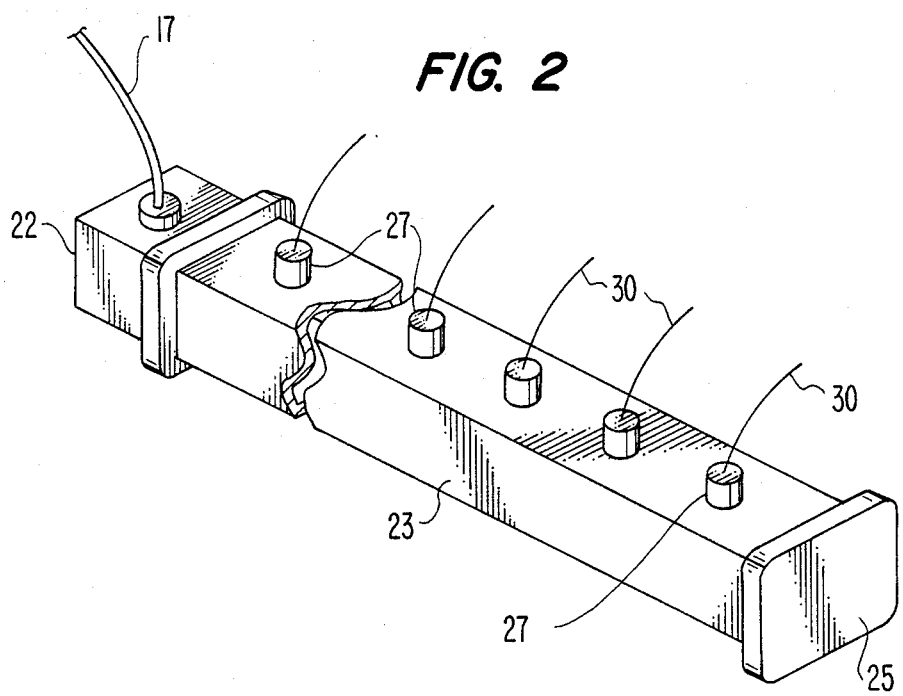
FIG. 2 is a detail of the preferred detector/waveguide assembly 20 shown in FIG. 1.

FIG. 2 shows a detail of the preferred detector/waveguide assembly 20. A signal on input cable 17 enters the coaxial/waveguide adaptor 22 and passes into one end of a rectangular waveguide 23. The opposing end of said waveguide is terminated by a shorting plate 25. A signal introduced into the waveguide by adapter 22 propagates down the waveguide, strikes the shorting plate, is completely reflected, and propagates back toward the source end of the waveguide. Upon entering the adapter 22, the reflected wave passes into cable 17 and is dissipated in the isolator 13 (FIG. 1).

Sensitive detectors 27—27 are placed along the length of the waveguide at regular intervals in a line parallel to the direction of radio frequency propagation. These detectors measure the radio frequency power in the waveguide by removing an infinitesimal amount of said power and producing outputs on lines 30—30.

There are present, at each point in the waveguide, two contributions to the electromagnetic field corresponding to the forward and backward propagating waves, respectively. These contributions are both replicas of the input signal, but are displaced in time with respect to each other. Thus, the averaged output of any of the detectors produces a term proportional to the signal's autocorrelation evaluated at the delay between the two contributions seen at the detector site.

Figure 3:
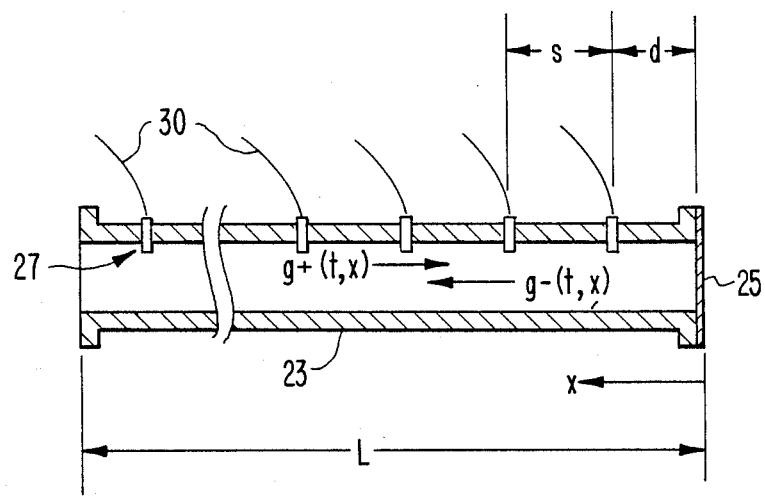
FIG. 3 is a cross section of the waveguide/detector assembly, less the coaxial adapter, which illustrates dimensions and mathematical quantities for the mathematical discussion.

My invention may be better understood by a mathematical examination of its operation, aided by reference to FIG. 3. The numerical designators in FIG. 3 identify the same elements as do the corresponding numbers in FIGS. 1 and 2.

Let g(t) denote the signal as introduced to the waveguide by the adaptor 22. This signal may be expressed in terms of its Fourier transform G(f):

$$g(t) = \int_{-\infty}^{\infty} G(f) e^{j2\pi f t} df.$$

It will be supposed that the frequencies of the signal are confined to the interval $[f_L, f_H]$ and that these frequencies propagate in the lowest order mode of the waveguide. For computational ease, it will also be supposed that the signal g(t) is zero outside of the observation interval [0,T]. Let $\gamma$ be the guide attenuation constant (also including loss to detectors), let L be the length of the waveguide, x be the position along the waveguide from the shorted end, c be the speed of light, $f_c$ be the guide cutoff frequency, and $$\beta(f) = |1 - (f_c/f)^2|^{\frac{1}{2}}$$

be the guide wavelength dilation for frequency f. The forward-propagating wave in the guide can be written as $$g_+(t,x) = e^{-\gamma(L-x)} \int_{-\infty}^{\infty} G(f) e^{j2\pi f[t-(L-x)\beta(f)/c]} df.$$

Similarly, the backward-propagating wave may be expressed as $$g_-(t,x) = -e^{-\gamma(L+x)} \int_{-\infty}^{\infty} G(f) e^{j2\pi f[t-(L+x)\beta(f)/c]} df.$$

(The minus sign in front of the exponential is a result of reflection by a short.) As a result of these two contributions, the instantaneous power at time t and position x is $$P(t,x) = |g_+(t,x) + g_-(t,x)|^2 = |g_+(t,x)|^2 + |g_-(t,x)|^2 + 2Re\{g_+(t,x)g^*_-(t,x)\}$$

On the waveguide are placed n detectors, with the ith detector located at $x = is + d$, $i = 0, 1, 2, \ldots, n-1$. Each detector's output is proportional to the radio frequency power at the location of the detector. The ith such output is then integrated by an integrator to produce the result $$I_i = \int_0^T P(t, is + d) dt.$$

(A proportionality constant has been dropped.) This integration also includes the temporal response of the detector. Let $$H(f) = \int_0^T e^{-j2\pi f t} dt$$

denote the Fourier transform of the temporal observation window.

The integrator outputs $\{I_i\}$ may be considered the sum of two contributions. The first term, which is undesired, is due to the self-square terms in P and is given by $$I_i^s = e^{-2\gamma(L-is-d)} \int_{-\infty}^{\infty}\int_{-\infty}^{\infty} G(f_1)G^*(f_2)H^*(f_1-f_2)e^{-j2\pi[f_1\beta(f_1)-f_2\beta(f_2)](L-is-d)/c} df_1 df_2 +$$

$$e^{-2\gamma(L+is+d)} \int_{-\infty}^{\infty}\int_{-\infty}^{\infty} G(f_1)G^*(f_2)H^*(f_1-f_2)e^{-j2\pi[f_1\beta(f_1)-f_2\beta(f_2)](L+is+d)/c} df_1 df_2.$$

The second contribution, which is desired, is due to the product of the forward- and backward-propagating waves and is given by $$I_f^c = -2e^{-2\gamma L} Re\left\{ \int_{-\infty}^{\infty}\int_{-\infty}^{\infty} G(f_1)G^*(f_2)H^*(f_1-f_2)e^{-j2\pi[f_1\beta(f_1)-f_2\beta(f_2)]L/c}e^{j2\pi[f_1\beta(f_1)+f_2\beta(f_2)](is+d)/c}df_1df_2 \right\}.$$

(The Re{ } above may be dropped since $\beta(f)=\beta(-f)$, $G^*(f)=G(-f)$, and $H^*(f)=H(-f)$.)

The integration period is sufficiently long that when $f_1$ and $f_2$ allow $H(f_1-f_2)$ to have a nonnegligible value, $\beta(f_1)$ may be treated as equal to $\beta(f_2)$ and $[f_1\beta(f_1)-f_2\beta(f_2)]L/c$ is much less than 1. Using these observations, the integrator outputs may be expressed as $$I_i^s = 2e^{-2\gamma L}\cosh[2\gamma(is+d)] \int_{-\infty}^{\infty}\int_{-\infty}^{\infty} G(f)G^*(f-\Delta)H^*(\Delta)dfd\Delta$$

and $$I_i^c = -2e^{-2\gamma L} \int_{-\infty}^{\infty}\int_{-\infty}^{\infty} G(f)G^*(f-\Delta)H^*(\Delta)e^{j4\pi f\beta(f)(is+d)/c}dfd\Delta.$$

Finally, since the signal g is constrained to be zero outside of the observation window, $$\int_{-\infty}^{\infty} G^*(f-\Delta)H^*(\Delta)d\Delta = G^*(f),$$

so that $$I_i^s = 2e^{-2\gamma L}\cosh[2\gamma(is+d)] \int_{-\infty}^{\infty} |G(f)|^2 df$$

and $$I_i^c = -2e^{-2\gamma L} \int_{-\infty}^{\infty} |G(f)|^2 e^{j4\pi f\beta(f)(is+d)/c} df.$$

The n integrator outputs are fed, via a multiplexer, to a discrete N-point Fourier transform device to produce the values $\{S_k, k=0, 1, 2, \ldots, N-1\}$, where $$S_k = \sum_{i=0}^{n-1} I_i e^{-j2\pi k(i+i_0)/N} = \sum_{i=0}^{n-1} (I_i^s + I_i^c)e^{-j2\pi k(i+i_0)/N} = $$

$$S_k^s + S_k^c,$$

and where $i_0$ is chosen as described below and the two contributions to $S_k$ are defined in the obvious way. This ignores, for the present, the multiplication by weights.

First consider the desired contribution, $S_k^c$, which may be expressed in terms of $$W(z) = \frac{\sin(\pi n z)}{\sin(\pi z)},$$

which results from the transform of the observation window. In terms of W, $$S_k^c = -2e^{-2\gamma L} \int_{-\infty}^{\infty} |G(f)|^2 e^{j2\pi[2f\beta(f)d/c-ki_0/N]} e^{j\pi(n-1)[2f\beta(f)s/c-k/N]} W[2f\beta(f)s/c - k/N]df.$$

In order to avoid sign precession, the choice $i_0 = d/s$ is made; that is, if construction constraints require d be at least some minimum value, then d can be chosen as the least allowed multiple of s. With this choice, $$S_k^c = -2e^{-2\gamma L} \int_{-\infty}^{\infty} |G(f)|^2 e^{j\pi(2i_0+n-1)[2f\beta(f)s/c-k/N]} W[2f\beta(f)s/c - k/N]df.$$

The function W peaks when its argument is an integer. Around each integer, the nominal width of the center lobe is 1/n. It may be seen that the function W serves to select which frequencies of g are permitted to contribute to $S_k$. For each choice of k, frequencies f satisfying $$|2f\beta(f)s/c - (k/N + m)| \leq \frac{1}{2n}$$

for any integer m form the nominal kth output. As the frequency gets close to the edge of the band, the phase also begins to rotate.

To avoid aliasing of one frequency in the band of interest with another, the input frequency band must be chosen so that $2f\beta(f)s/c$ ranges over an interval of length less than ½. Thus, the system can support approximately n/2 independent frequency resolution cells. These cells are examined using k in the range 0, 1, 2, . . ., N/2−1 or in the range N/2, N/2+1, . . . , N−1. The size of the transform, N may be chosen equal to n, or may be made larger to obtain more, but overlapping, cells.

An important feature is that these cells may correspond to any range of the form $2f\beta(f)s/c\epsilon[m, m+½]$ or $2f\beta(f)s/c\epsilon[m+½, m+1]$, respectively. Thus, the same number of detectors, with the same spacing, can cover the frequency band $[f_L, f_H]$ or a translated band $[f_L+f_T, f_H+f_T]$. The advantage of using this latter band with $f_T>0$ is that the fractional bandwidth may be made smaller, making component requirements less stringent and making the range of B(f) smaller (and perhaps negligible).

Note that the relationship between k and associated center frequency is not linear and is, in fact, given by $$f = \left[ f_c^2 + \left(\frac{c}{2s}\right)^2 \left(m + \frac{k}{N}\right)^2 \right]^{\frac{1}{2}}.$$

This nonlinearity may become negligible if the waveguide is operated at a sufficiently small fractional bandwidth away from cutoff.

Now consider the undesired output term $S_k{}^s$. Its amplitude dependence on k is of the form $$\frac{\sinh[n(j\pi k/N \pm ys)]}{\sinh(\pi k/N \pm ys)},$$

which peaks when k is a multiple of N and is small elsewhere. Thus, this term only interferes with at most a few of the useable values of k. To avoid such interference, the range of inputs must be slightly curtailed, so that slightly less than n/2 resolution cells may be covered.

The preferred embodiment of my invention includes provision for weighting the integrated detector outputs before Fourier transforming them. Not only does this permit correction of variation in detector coupling, but it also allows the well-known advantages of windowing to be applied. The windowing may be used to alter crosstalk characteristics, as is commonly done for low frequency spectrum analysis. In particular, the function W may be given lower sidelobes at the expense of a wider center lobe.

It may also be observed that the integrators need not be strict integrators as described, but can be simpler low pass filters. Further, said low pass filter outputs need not be sampled and held, but need only be sampled by the analog multiplexer. Note also that the detectors' slow temporal response may serve to perform the integration.

Those skilled in the art will recognize that many functionally equivalent embodiments of my invention are possible. Several media exist for guiding the radio frequency signal, including, but not limited to, dielectric stripline and conducting stripline. The isolator may either be a part of the guiding medium or, as described above, be placed in the input line.

Various arrangements of apparatus may be used to effect superposition of two replicas of the signal, including the introduction, at opposite ends of a guiding medium, of two replicas of the signal derived from a splitter. Also, the two propagating replicas need not traverse opposite, though otherwise identical, paths in the guiding medium; it is sufficient that they propagate in different directions and are partially superimposed for the required distance.

The Fourier transform may be implemented in digital electronic hardware, optical hardware, analog electronic hardware, or other means. (Any analog approach obviates the need for an analog-to-digital converter) Further, the integrated detector outputs may be accommodated by the Fourier transform device in parallel form, rather than the serial form used in the preferred embodiment.

I claim:

1. Spectrum analysis apparatus, comprising:
   a radio frequency signal source;
   means for guiding radio frequency propagation;
   means for superimposing two replicas of the signal from said signal source in said guiding means such that the replicas propagate in different directions;
   means for simultaneously measuring the radio frequency power in said guiding means at multiple spatial locations;
   means for temporally integrating said power measurements; and
   means for effecting a Fourier transform of said integrated power measurements.

2. The apparatus of claim 1, wherein said guiding means is a waveguide.

3. The apparatus of claim 1 or 2, wherein said superposition means further comprises termination by a shorting device.

4. The apparatus of claim 1 or 2, wherein said superposition means further comprises means for introducing said signal into opposite ends of said guiding means.

5. The apparatus of claim 1 or 2 wherein said Fourier transform means further comprises means for input weighting.

6. A spectrum analysis system, comprising:
   a radio frequency signal source;
   means for guiding radio frequency propagation;
   means for translating said radio frequency signal in frequency;
   means for superimposing two replicas of the translated signal from said frequency translating means in said guiding means such that the replicas propagate in different directions;
   means for simultaneously measuring the radio frequency power in said guiding means at multiple spatial locations;
   means for temporally integrating said power measurements; and
   means for effecting a Fourier transform of said integrated power measurements.

7. The apparatus of claim 6, wherein said guiding means is a waveguide.

8. The apparatus of claim 6 or 7, wherein said superposition means further comprises termination by a shorting device.

9. The apparatus of claim 6 or 7, wherein said superposition means further comprises means for introducing said signal into opposite ends of said guiding means.

10. The apparatus of claim 6 or 7 wherein said Fourier transform means further comprises means for input weighting.

* * * * *